(12) United States Patent
Eliyahu et al.

(10) Patent No.: US 8,155,913 B2
(45) Date of Patent: Apr. 10, 2012

(54) PHOTONIC-BASED CROSS-CORRELATION HOMODYNE DETECTION WITH LOW PHASE NOISE

(75) Inventors: Danny Eliyahu, Pasadena, CA (US);
Nikolai Morozov, Orinda, CA (US);
Lute Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 562 days.

(21) Appl. No.: 12/270,845

(22) Filed: Nov. 13, 2008

(65) Prior Publication Data

US 2009/0208205 A1    Aug. 20, 2009

Related U.S. Application Data

(60) Provisional application No. 61/002,918, filed on Nov. 13, 2007.

(51) Int. Cl.
*H04B 10/08* (2006.01)
(52) U.S. Cl. ........................................................ 702/117
(58) Field of Classification Search .................... 702/117
See application file for complete search history.

(56) References Cited

U.S. PATENT DOCUMENTS

| | | |
|---|---|---|
| 5,204,640 A | 4/1993 | Logan, Jr. |
| 5,220,292 A | 6/1993 | Bianchini et al. |
| 5,495,500 A | 2/1996 | Jovanovich et al. |
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |
| 6,178,036 B1 | 1/2001 | Yao |
| 6,203,660 B1 | 3/2001 | Unger et al. |

(Continued)

FOREIGN PATENT DOCUMENTS

WO        01/96936        12/2001

(Continued)

OTHER PUBLICATIONS

E. N. Ivanov, Noise Properties of Microwave Signals Synthesized with Femtosecond Lasers, 2005 IEEE, School of Physics, University of Western Australia, 35 Stirling Hwy, Crawley, 6009, Time and Frequency Division, National Institute of Standards and Technology, 325 Broadway, Boulder, CO 80305, p. 932-936.*

(Continued)

*Primary Examiner* — Tung S Lau
(74) *Attorney, Agent, or Firm* — Perkins Coie LLP

(57) ABSTRACT

In one aspect, this document provides an implementation of a system for characterizing an oscillator. This system includes an input port that receives an oscillation signal from an oscillator under test; an input port signal splitter that splits the received oscillation signal into a first oscillation signal and a second oscillation signal; a first photonic signal processing branch circuit that processes the first oscillation signal to produce a first branch output signal; a second photonic signal processing branch circuit that processes the second oscillation signal to produce a second branch output signal; a dual channel signal analyzer that receives the first and second branch output signals to measure noise in the received oscillation signal; and a computer controller that controls the first and second photonic signal processing branch circuits and the dual channel signal analyzer to control measurements of the noise in the received oscillation signal.

9 Claims, 1 Drawing Sheet

U.S. PATENT DOCUMENTS

| | | | |
|---|---|---|---|
| 6,317,214 B1 | 11/2001 | Beckett et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0046952 A1 | 3/2007 | Kikuchi |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

W. Guan and J. R. Marciante, Dual-Frequency Operation in a Short-Cavity Ytterbium-Doped Fiber Laser, IEEE Photonics Technology Letters, vol. 19, No. 5, Mar. 1, 2007, p. 261-263.*

Braginsky, V.B., et al., "Quality-Factor and Nonlinear Properties of Optical Whispering-Gallery Modes," *Physics Letters A*, 137(7, 8):393-397, May 1989.

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

International Search Report and Written Opinion dated May 21, 2009 for International Application No. PCT/US2008/012815, filed Nov. 13, 2008 (7 pages).

\* cited by examiner

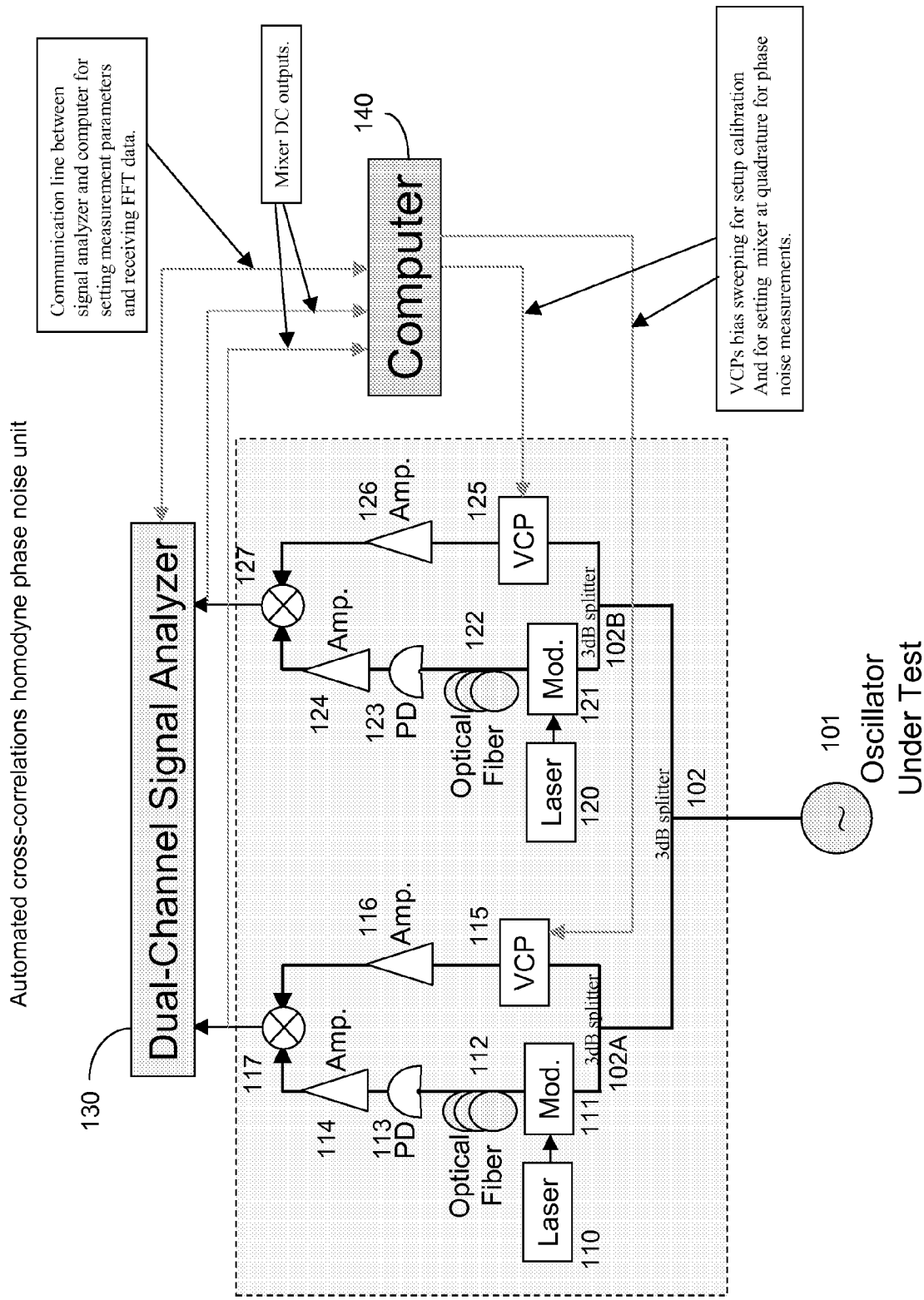

PHOTONIC-BASED CROSS-CORRELATION HOMODYNE DETECTION WITH LOW PHASE NOISE

PRIORITY CLAIM AND RELATED APPLICATION

This document claims the benefits of U.S. Provisional Application No. 61/002,918 entitled "PHOTONIC-BASED CROSS-CORRELATION HOMODYNE DETECTION WITH LOW PHASE NOISE" and filed Nov. 13, 2007, the disclosure of which is incorporated by reference as part of the specification of this document.

BACKGROUND

This application relates to oscillators and characterization of oscillators, including oscillators in RF, microwave, or millimeter spectral range.

An oscillator is a device that produces an oscillation signal at a desired oscillation frequency. The output of the oscillator may be used as a frequency reference for various applications and thus it is desirable that the noise of the oscillator be low and can be properly measured. A measurement apparatus for characterizing an oscillator should have low noise.

SUMMARY

In one aspect, this document provides an implementation of a system for characterizing an oscillator. This system includes an input port that receives an oscillation signal from an oscillator under test; an input port signal splitter that splits the received oscillation signal into a first oscillation signal and a second oscillation signal; a first photonic signal processing branch circuit that processes the first oscillation signal to produce a first branch output signal; a second photonic signal processing branch circuit that processes the second oscillation signal to produce a second branch output signal; a dual channel signal analyzer that receives the first and second branch output signals to measure noise in the received oscillation signal; and a computer controller that controls the first and second photonic signal processing branch circuits and the dual channel signal analyzer to control measurements of the noise in the received oscillation signal.

In one implementation of the above system, the first photonic signal processing branch circuit includes a first signal splitter to splits the first oscillation signal into a first branch signal and a second branch signal; a photonic branch that receives the first branch signal and comprises a laser that produces a laser beam, an optical modulator that modulates the laser beam in response to the first branch signal to produce a modulated laser beam that carries the first branch signal, an optical delay unit that transmits the modulated laser beam to produce a delay in the modulated laser beam, and an optical detector that converts the modulated laser beam into a detector signal; an electrical branch that receives the second branch signal and comprises a voltage controlled phase shifter that receives the second branch signal and to changes a phase of the second branch signal to produce an output signal; and a signal mixer that mixes the detector signal and the output signal to produce the first branch output signal.

These and other features are described in greater detail in the drawings, the description and the claims.

BRIEF DESCRIPTION OF DRAWINGS

FIG. 1 shows an example for an automated opto-electronics cross-correlation homodyne phase noise setup to illustrate various technical features.

DETAILED DESCRIPTION

This application describes techniques, apparatus and systems for characterizing oscillators in RF, microwave, or millimeter spectral range based on photonic components.

FIG. 1 shows an example for an automated opto-electronics cross-correlation homodyne phase noise setup to illustrate various technical features. This exemplary setup is implemented via optical fiber serving as a long delay line. The dual homodyne setup is then cross correlated at the signal analyzer to reduce the noise of each of the homodyne branches by averaging out noise that is not correlated with the oscillator under test.

Phase noise measurements of microwave/RF oscillators generating high purity electromagnetic signals requires low phase noise measurement setup. The present technique can be used to reduce the noise floor of a single homodyne measurement setup by cross correlating the signals of two measurement setups. In this way, the uncorrelated noise from each of the setups is averaged out at the signal analyzer. The phase noise floor of the cross-correlated dual systems can be improved by 20 log(N) (in dB units), where N is the number of averages.

Each of the two measurement setups is an electro-optic homodyne setup with two signal branches. A signal splitter splits a received microwave/RF signal into the two branches. The oscillator 101 under test is coupled to the input port of the system which includes an input port splitter 102. The two signal branches include two branch signal splitters 102A and 102B, respectively. Each of the splitters 102A and 102B splits the received signal into two signals for two branches.

The first signal branch is a photonic signal branch which includes a high-speed optical modulator (MOD) 111 or 121 to modulate a CW laser beam from a laser 110 or 121 in response to the microwave/RF signal to produce a modulated optical signal that carries the microwave/RF signal. The modulated optical signal is directed along an optical fiber which serves as a signal delay line 112 or 122, allowing for efficient discrimination of the noise. The increase of the length of the fiber 112 or 122 leads to an increased delay of the signal and reduces the close-in phase noise of the setup. The photodetector (PD) 113 or 123 converts the modulated light back into a microwave signal which is then amplified by an amplifier 114 or 124. The second signal branch includes a voltage controlled phase shifter (VCP) 115 or 125 and a signal amplifier 116 or 126. A signal mixer 117 or 127 is used to combine the two branches together to mix the signals from the two branches to produce a beat signal.

A dual channel signal analyzer 130 is provided to receive the beat signals from the two measurement setups.

Such a system can be automated by using a voltage controlled phase shifters (VCPs) and a computer controller 140. The VCPs 115 and 125 are used for the calibration (voltage to phase) of the setup and for tuning the phase of the signal at the mixer (bring to quadrature) so it would be sensitive to phase noise. The computer or microprocessor is used to carry out the measurement automatically. The computer measures the calibration factor and put the mixer in quadrature. The computer also controls the signal analyzer parameters, such as frequencies, the number of averages, the resolution, the bandwidth etc. In addition, the computer plots the phase noise at the monitor and allows for saving the data.

Following is a tuning and calibration procedure for the cross-correlation homodyne phase noise set-up in FIG. 1. The computer can be operated to perform this procedure automatically.

1. Calibration:
   a. The computer sweeps the bias voltage over the voltage controlled phase shifters (VCPs), and at the same time records the mixers output voltage response through an A/D card.
   b. Stored calibrated formulas for the voltage controlled phase shifters as a function of the VCP's bias voltage, $\phi$ (VVCP), allow the computer to calculate the calibration responses between phases to the mixer voltage ($\Delta\phi/\Delta$Vmixer at Vmixer=0), for each of the two identical setups.
2. Quadrature Setting:
   a. The computer tunes the VCPs bias voltage so that the mixers are at zero DC output. This sets the mixers at quadrature, which makes them phase noise sensitive (low sensitivity to amplitude noise at saturation).
3. Phase Noise Measurements:
   a. The computer controls the signal analyzer in terms of range of measurement frequencies, resolution bandwidth, number of averages (the user has control over these parameters through the user interface software) and other parameters.
   b. The computer retrieves the mixer's voltage fluctuations FFT data from the signal analyzer.
   c. At the same time, the computer monitors the mixers voltage. If the voltage drifts over the allowable range due to oscillator frequency drift and/or the delay thermal drift, then the computer sets the signal analyzer on a pause mode, brings the system to quadrature again, and continues with the FFT measurements.
   d. The data is then converted to phase noise spectral density using the calibration value measured in section 1 and the fiber delay length factor.
   e. The data is then plotted on the screen, and optionally could be stored into a file.

The noise floor of the system could be improved by increasing the number of FFT averages N. The noise floor drops as 5·log(N) (in dB units).

The above procedure describes only one of the software modes of operation. Other modes allow to use only one of the two homodyne setups, or measure the mixer voltage spectral density directly (for active/passive device phase noise measurements). The user also has control over the delay length.

This setup has the advantage of direct phase noise measurements (no need for second oscillator and phase locking). The RF carrier frequency range is wide and usually limited by the RF amplifiers and VCPS. In our current setup it is between 6 to 12 GHz.

In a recent build of a new cross correlation homodyne setup, the setup noise floor was improved and is currently better than:
   a. −110 dBc/Hz at 100 Hz offset
   b. −140 dBc/Hz at 1 kHz offset
   c. −170 dBc/Hz for >10 kHz offsets While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations and enhancements may be made.

What is claimed is:

1. A system for characterizing an oscillator, comprising:
   an input port that receives an electrical oscillation signal from an oscillator under test;
   an input port signal splitter that splits the received electrical oscillation signal into a first electrical oscillation signal and a second electrical oscillation signal;
   a first photonic signal processing branch circuit that coverts the first electrical oscillation signal into a first optical signal carrying the first electrical oscillation signal and processes the first optical signal to produce a first electrical branch output signal;
   a second photonic signal processing branch circuit that coverts the second electrical oscillation signal into a second optical signal carrying the second electrical oscillation signal and processes the second optical signal to produce a second electrical branch output signal;
   a dual channel signal analyzer that receives the first and second electrical branch output signals to measure noise in the received electrical oscillation signal; and
   a computer controller that controls the first and second photonic signal processing branch circuits and the dual channel signal analyzer to control measurements of the noise in the received electrical oscillation signal.

2. The system as in claim 1, wherein:
   the first photonic signal processing branch circuit comprises:
   a first signal splitter to splits the first oscillation signal into a first branch signal and a second branch signal;
   a photonic branch that receives the first branch signal and comprises a laser that produces a laser beam, an optical modulator that modulates the laser beam in response to the first branch signal to produce a modulated laser beam that carries the first branch signal, an optical delay unit that transmits the modulated laser beam to produce a delay in the modulated laser beam, and an optical detector that converts the modulated laser beam into a detector signal;
   an electrical branch that receives the second branch signal and comprises a voltage controlled phase shifter that receives the second branch signal and to changes a phase of the second branch signal to produce an output signal; and
   a signal mixer that mixes the detector signal and the output signal to produce the first branch output signal.

3. The system as in claim 2, wherein:
   the optical delay unit comprises a fiber delay line.

4. The system as in claim 2, wherein:
   the voltage controlled phase shifter is under a control of the computer controller.

5. The system as in claim 4, wherein:
   the computer controller controls the voltage controlled phase shifter to set a phase of the signal mixer at a quadrature condition.

6. A system for characterizing an oscillator, comprising:
an input port that receives an oscillation signal from an oscillator under test;
an input port signal splitter that splits the received oscillation signal into a first oscillation signal and a second oscillation signal;
a signal splitter to splits the first oscillation signal into a first branch signal and a second branch signal;
a first branch circuit that is coupled to the signal splitter to receive the first branch signal and includes a first branch splitter that splits the first branch signal into a first signal and a second signal, a first photonic branch circuit that receives the first signal, a first electrical branch that receives the second signal, and a first signal combiner that combines outputs from the first photonic branch and the first electrical branch to produce a first branch circuit signal,
wherein the first photonic branch circuit includes a first laser that produces a laser beam, a first optical modulator that modulates the laser beam in response to the first signal to produce a modulated laser beam that carries the first signal, a first optical delay unit that transmits the modulated laser beam to produce a delay in the modulated laser beam, and a first optical detector that converts the modulated laser beam into a first detector signal to the first signal combiner, and wherein the first electrical branch receives the second signal and comprises a voltage controlled phase shifter that receives the second signal and to change a phase of the second signal to produce an output signal to the first signal combiner;
a second branch circuit that is coupled to the signal splitter to receive the second branch signal and includes a second branch splitter that splits the second branch signal into a third signal and a fourth signal, a second photonic branch circuit that receives the third signal, a second electrical branch that receives the fourth signal, and a second signal combiner that combines outputs from the second photonic branch and the second electrical branch to produce a second branch circuit signal,
wherein the second photonic branch circuit includes a second laser that produces a laser beam, a second optical modulator that modulates the laser beam in response to the third signal to produce a modulated laser beam that carries the third signal, a second optical delay unit that transmits the modulated laser beam to produce a delay in the modulated laser beam, and a second optical detector that converts the modulated laser beam into a second detector signal to the second signal combiner, and wherein the second electrical branch receives the fourth signal and includes a voltage controlled phase shifter that receives the fourth signal and to change a phase of the fourth signal to produce an output signal to the second signal combiner;
a dual channel signal analyzer that receives the first and second branch circuit signals to measure noise in the received oscillation signal; and
a controller that controls the first and second photonic branch circuits and the dual channel signal analyzer to control measurements of the noise in the received oscillation signal.

7. The system as in claim 6, wherein:
the first or second optical delay unit includes a fiber delay line.

8. The system as in claim 6, wherein:
the voltage controlled phase shifter in the first or second electrical branch is under a control of the controller.

9. The system as in claim 8, wherein:
the controller controls the voltage controlled phase shifter to set a phase of the first or second signal combiner at a quadrature condition.

\* \* \* \* \*